United States Patent
Smith (10) Patent No.: US 8,762,085 B2
(45) Date of Patent: Jun. 24, 2014

(54) METHOD OF ESTIMATING SHORT CIRCUIT CURRENT AVAILABLE BY ANALYSIS OF DC CHARGING CIRCUIT

(75) Inventor: Timothy Lee Smith, Seneca, SC (US)

(73) Assignee: Schneider Electric USA, Inc., Palatine, IL (US)

( * ) Notice: Subject to any disclaimer, the term of this patent is extended or adjusted under 35 U.S.C. 154(b) by 924 days.

(21) Appl. No.: 12/903,540

(22) Filed: Oct. 13, 2010

(65) Prior Publication Data

US 2012/0095709 A1   Apr. 19, 2012

(51) Int. Cl.
*G01R 27/00* (2006.01)
*G01R 31/00* (2006.01)
*G01R 1/36* (2006.01)
*H02H 3/00* (2006.01)

(52) U.S. Cl.
USPC .................. 702/65; 702/57; 702/58; 702/64; 361/42; 324/142; 340/664; 700/292; 700/293

(58) Field of Classification Search
CPC ............ G06F 17/5036; G01R 19/2513; G01R 31/025; G01R 31/343; G01R 1/30; H02H 1/0015; H02H 3/00; G06Q 50/06
USPC .................. 702/57, 58, 64, 65, 189; 324/142; 340/664; 700/292, 293
See application file for complete search history.

(56) References Cited

U.S. PATENT DOCUMENTS

| | | | |
|---|---|---|---|
| 6,058,031 A | 5/2000 | Lyons et al. | |
| 6,150,768 A | 11/2000 | Nilssen | |
| 7,164,275 B2 | 1/2007 | Gasperi | |
| 7,844,440 B2 * | 11/2010 | Nasle et al. | 703/18 |
| 2008/0036472 A1 | 2/2008 | Collins, Jr. et al. | |
| 2008/0109205 A1 | 5/2008 | Nasle | |
| 2013/0066478 A1 * | 3/2013 | Smith | 700/293 |

OTHER PUBLICATIONS

International Search Report corresponding to co-pending International Patent Application Serial No. PCT/US2011/055016, European Patent Office, dated Jan. 11, 2012; (5 pages).

International Written Opinion corresponding to co-pending International Patent Application Serial No. PCT/US2011/055016, European Patent Office, dated Jan. 11, 2012; (8 pages).

Gammon T et al: "Conventional and recommended arc power and energy calculations and arc damage assessment", IEEE Transactions on Industry Applications, IEEE Service Center, dated May 1, 2003; (6 pages).

* cited by examiner

*Primary Examiner* — Sujoy Kundu
*Assistant Examiner* — L. Anderson
(74) *Attorney, Agent, or Firm* — Locke Lord LLP (57) ABSTRACT

A system and method of dynamically estimating the short circuit current availability (SCCA) at a node in an alternating current electrical distribution system by examining the spectral composition of current drawn by a direct current charging circuit connected to the node. A correlative relationship between the total harmonic current distortion (THDi) in the current drawn by the charging circuit and the SCCA at the node is established for a particular charging circuit. An estimation of the SCCA at the node is accomplished by taking current measurements of current drawn by the charging circuit, analyzing those current measurements to determine the THDi, and estimating a corresponding value of SCCA based on the determined THDi. A method is also provided for calibrating a particular charging circuit to have a reactance and resistance suitable for use in estimating SCCA.

21 Claims, 4 Drawing Sheets

METHOD OF ESTIMATING SHORT CIRCUIT CURRENT AVAILABLE BY ANALYSIS OF DC CHARGING CIRCUIT

FIELD OF THE INVENTION

The present disclosure relates generally to estimation of arc flash hazard potential at a node in an electrical power delivery system, and, more particularly, to a system and method of dynamically estimating the short circuit current availability at a node in an alternating current electrical circuit based on the total harmonic current distortion of the current drawn by a direct current charging circuit also connected to the node.

BACKGROUND

An arc flash event generally occurs when air is ionized to conduct electrical energy between two conductors that have a voltage potential. During an arc flash event, energy is released that may cause burns and other injuries to anyone or anything that is in proximity to the event. Under requirements from the Occupational Safety and Health Administration (OSHA), employers are required to categorize arc flash hazard potential in areas where workers are required to conduct work on or near live electrical equipment, and to provide proper guidelines on proper protective wear and safe working distances for their workers. In order to categorize the arc flash hazard potential, a detailed study of the electrical system is generally required to determine: the short circuit current availability, the distance from the power supply station, the infrastructure connecting the particular node to the power supply station, and details about the circuit breaker safety shut-offs and their response-time profiles.

Generally, the most costly parameter to estimate is the short circuit current available (SCCA), which is a measure of the amount of current that can be drawn from a particular node in an alternating current (AC) electrical circuit in the event of a short-circuit event. Once an accurate estimate of SCCA is made, determining the arc flash hazard potential can be performed according to the methods provided in, for example, publication 1584 of the Institute of Electrical and Electronics Engineers (IEEE 1584). Similarly, the arc flash hazard potential category can be determined according to the methods provided in standard 70E of the National Fire Protection Association (NFPA 70E). The arc flash hazard potential and arc flash hazard potential category can be used by workers to, for example, identify a safe working distance, select suitable personal protective wear, and to otherwise maintain a safe working environment. Typically, estimations of SCCA are made by considering the distance of the particular node from the power generation station, the nature of the transformers connecting the particular node to the power distribution system supply wires, and the gauge and materials of the conductors connecting the particular node to the transformers. But these methods may undesirably lead to over-estimates of SCCA.

Overestimates of SCCA can be dangerous and may lead to lower calculated incident energy in the event of an arc flash than the risk that is actually presented, because many protective devices have inverse, or extremely inverse time-response curves such that a very high-current arc flash will trigger the protective device very quickly and result in less incident energy than a relatively low-current arc flash that is allowed to endure for a longer duration due to the delayed reaction of the protective device. It is desirable, therefore, to accurately estimate SCCA at a particular node in an AC electrical circuit.

Furthermore, it is desirable to estimate SCCA dynamically, and in real time so as to provide updated SCCA information as SCCA changes due to, for example, changes in the configuration of the power distribution system.

BRIEF SUMMARY

Provided herein is a method for estimating a quantity of short circuit current available (SCCA) at a node in an alternating current (AC) electrical circuit. The present disclosure provides for analyzing the current drawn by a direct current (DC) charging circuit connected to the node in the AC electrical circuit. The current is analyzed to determine the total harmonic current distortion (THDi). Aspects of the present disclosure provide for establishing a correlation between the determined values of THDi and SCCA of the AC electrical circuit at the point of measurement. Using the correlation between THDi of the DC charging circuit and the SCCA of the AC electrical circuit, implementations of the present disclosure provide a method for estimating a quantity of SCCA based on the determined THDi.

Aspects of the present disclosure note that a plot of THDi against SCCA reveals two regions, or ranges of SCCA, with the two regions separated by an inflection point. While the correlation in one region can be modeled by a polynomial, the region beyond the inflection point is not as readily described mathematically. Methods are disclosed for advantageously adjusting or tuning parameters of the DC charging circuit in order to maintain the correlation between THDi and SCCA in the region of the correlation relationship that can be accurately modeled. Implementations of the present disclosure further provide for dynamically adjusting parameters of the DC charging circuit in order to maintain the DC charging circuit in a region of the correlation relationship that can be accurately modeled even as SCCA may change dynamically due to, for example, changes in the configuration of the AC electrical circuit. Aspects of the present disclosure further provide for methods of using the estimate of SCCA to compute values of the arc flash hazard potential and arc flash hazard potential category and communicating that information.

The foregoing and additional aspects and implementations of the present disclosure will be apparent to those of ordinary skill in the art in view of the detailed description of various embodiments and/or aspects, which is made with reference to the drawings, a brief description of which is provided next.

BRIEF DESCRIPTION OF THE DRAWINGS

The foregoing and other advantages of the present disclosure will become apparent upon reading the following detailed description and upon reference to the drawings.

DETAILED DESCRIPTION

Figure 1:
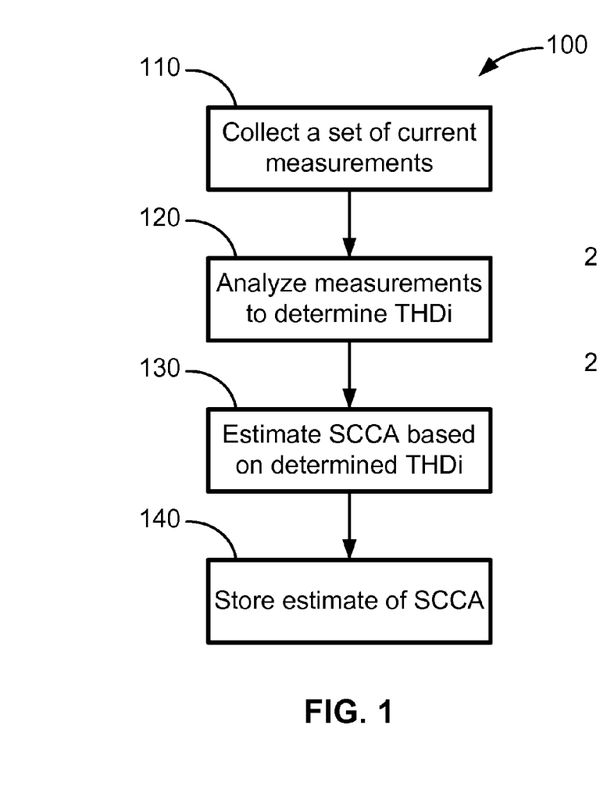
FIG. 1 is a flowchart providing an exemplary implementation of the present disclosure for estimating the short circuit current available at a node in an alternating current electrical circuit by measuring the total harmonic current distortion of current drawn by a direct current charging circuit connected to the node.

FIG. 1 is a flowchart 100 providing an exemplary implementation of the present disclosure for estimating the short circuit current available (SCCA) at a node in an alternating current (AC) electrical circuit. SCCA is estimated by measuring the total harmonic current distortion (THDi) of current drawn by a direct current (DC) charging circuit connected to the node. In an implementation, the current flowing into the DC charging circuit is measured with a current sensor to form a set of measurements. The THDi of the current flowing into the DC charging circuit is determined based on the set of measurements. An estimate of a quantity of SCCA is made based on an established correlation between the THDi in the DC charging circuit and SCCA at the node of interest in the AC electrical circuit. The flowchart 100 provides for the collection of a set of current measurements (110), analyzing those measurements to determine the THDi (120), estimating a quantity of SCCA based on the determined value of THDi (130), and storing the estimate of SCCA in a memory (140). In an example configuration, the node of interest in the AC electrical circuit can be a point of common coupling (PCC) as that terms is understood by those skilled in the art of power systems. The node of interest can be an access point where a user can access a disconnect and protective devices. The node of interest can also be a point where, when permanently installed, a device such as a transformer is self-protected.

It should be emphasized that the term THDi and SCCA are used as those terms are commonly understood by those skilled in the art of power systems. The lowercase "i" in THDi refers to current as opposed to other types of input waveforms that can be used to determine total harmonic distortion. SCCA is a measure of the amount of current that can be drawn from a particular node in an alternating current (AC) electrical circuit in the event of a short-circuit event. THDi is typically expressed as a percentage or a ratio and SCCA is typically expressed in kilo-amperes (kA).

Following the estimating a quantity of SCCA based on the determined value of THDi (130), an implementation of the present disclosure can optionally calculate the arc flash hazard potential based in part on the estimated quantity of SCCA, for example, according to formulae provided in publication 1584 of the Institute of Electrical and Electronics Engineers (IEEE 1584). The arc flash hazard potential category can optionally be determined, for example, according to the methods provided in standard 70E of the National Fire Protection Association (NFPA 70E). An implementation can communicate the determined SCCA, arc flash hazard potential or arc flash hazard potential category by displaying the information on a user interface. The user interface can incorporate: a display, blinking lights, an audible alarm, or any other device suitable for communicating information. Alternatively or additionally, an implementation can communicate the information by sending the information to a recipient. In a configuration, the communication of the determined SCCA, arc flash hazard potential or arc flash hazard potential category can be performed when either exceeds, or drops below, a threshold value. Implementations of the present disclosure also provide for communicating the estimated quantity of SCCA and for communicating an alert in the event that the estimated quantity of SCCA exceeds a threshold value. In an example configuration, the alert can be communicated by displaying the alert information on a user interface such as the user interface described above or by sending the alert information to a recipient.

Figure 2A:
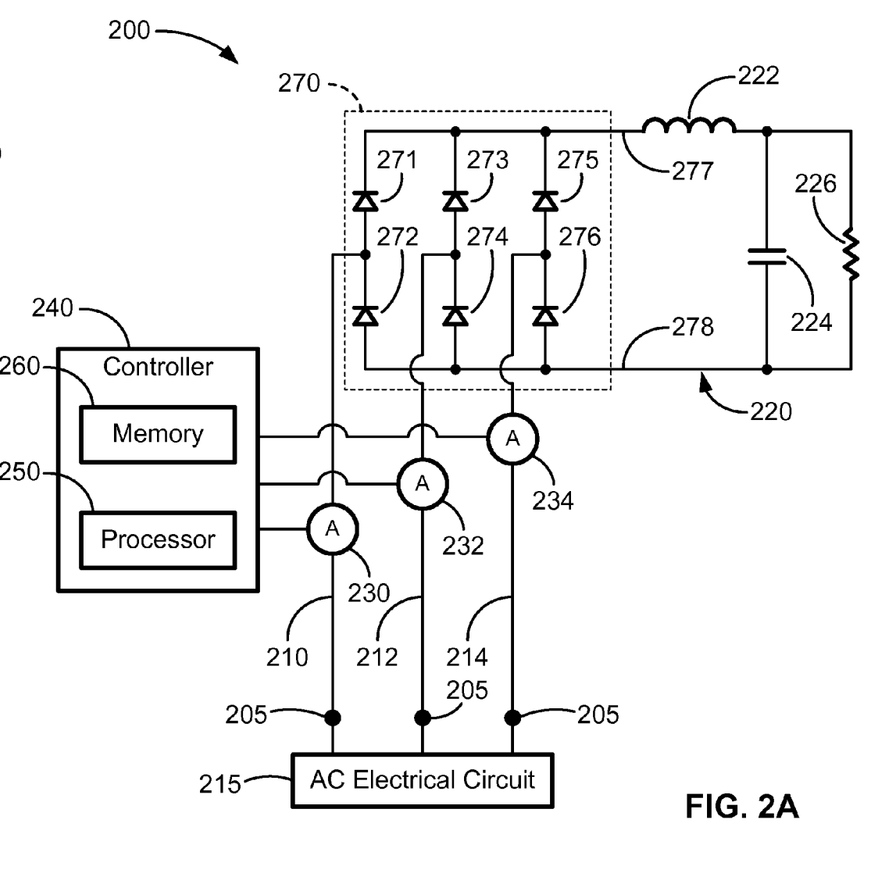
FIG. 2A provides an example configuration of a system for measuring the total harmonic current distortion of current flowing into a direct current charging circuit connected to a node of an alternating current electrical circuit.

FIG. 2A provides an example configuration of an SCCA estimation system 200. The SCCA estimation system 200 includes an AC electrical circuit 215 having a first line 210, a second line 212, and a third line 214. In the example configuration provided, the three lines (210, 212, 214) each carry voltage and current waveforms that are phase offset from the others by 120 degrees. The three lines (210, 212, 214) are electrically connected to a DC charging circuit 220. Current delivered by the three lines (210, 212, 214) is measured with respective current sensors (230, 232, 234) connected in series to the corresponding lines (210, 212, 214). The current sensors (230, 232, 234) are also connected to a controller 240. The controller 240 includes a processor 250 and a memory 260. The controller 240 is configured to receive a set of current measurements taken by the current sensors (230, 232, 234). Any of the current sensors (230, 232, 234) can operate to measure the current drawn by the DC charging circuit 220 and report the current measurements to the controller 240. The SCCA estimation system 200 is configured to use the set of current measurements to form an estimate of a quantity of SCCA at a node 205. The node 205 is a point on any of the three lines (210, 212, 214) where current is flowing to the DC charging circuit 220 from the AC electrical circuit 215. The processor 250 is used by the controller 240 to determine THDi based on the set of current measurements and to estimate a quantity of SCCA based on the determined THDi. The processor 250 can optionally be used by the controller 240 to calculate an arc flash hazard potential according based on an estimated quantity of SCCA and additional values that can be supplied by a user or supplied by additional measurement devices. The processor 250 can further be used to correlate the arc flash hazard potential to an arc flash hazard potential category. The memory 260 is used by the controller 240 to store the set of current measurements received from the current sensors (230, 232, 234) and to store estimates of SCCA and determinations of THDi. The memory 260 can optionally be used to store the arc flash hazard potential and the arc flash hazard potential category.

The DC charging circuit 220 includes an inductor 222, a capacitor 224, a resistor 226, and a diode rectifier 270. The diode rectifier 270 includes six diodes: a first diode 271, a second diode 272, a third diode 273, a fourth diode 274, a fifth diode 275, and a sixth diode 276. The three lines (210, 212, 214) of the AC electrical circuit 215 are connected to the diode rectifier 270. The first line 210 is electrically connected to the anode of the first diode 271 and the cathode of the second diode 272. The second line 212 is connected to the anode of the third diode 273 and the cathode of the fourth diode 274. The third line 214 is connected to the anode of the fifth diode 275 and the cathode of the sixth diode 276. The anodes of the second diode 272, fourth diode 274, and sixth diode 276 are connected to a first DC output 277 of the diode rectifier 270. The cathodes of the first diode 271, third diode 273, and fifth diode 275 are connected to a second DC output 278 of the diode rectifier 270. In an implementation, the resulting configuration of the diode rectifier 270 can be referred to as a diode bridge. The diode rectifier 270 can operate to rectify AC current from the AC electrical circuit 215 into DC current in the DC charging circuit 220. The inductor 222, the capacitor 224, and the resistor 226 combine to simulate the effect of a load on the DC charging circuit 220. The inductor 222 is connected in series between the first DC output 277 and the capacitor 224. The capacitor 224 is connected in series between the inductor 222 and the second DC output 278. The resistor 226 is connected in parallel across the capacitor 224. In an example configuration, the DC charging circuit 220 can be used for experimental purposes to engineer the inductive, capacitive, and resistive parameters of the DC charging circuit 220.

While the above configuration has been described using a diode rectifier 270 to supply a DC current to the DC charging circuit 220, aspects of the present disclosure relate to similar systems incorporating any rectifier circuit for supplying DC current from an AC current supply, including, for example, systems incorporating solid-state switching arrays composed of six or more insulated-gate bipolar transistors. Configurations can optionally be implemented where the DC charging circuit 220 is connected to only two current-carrying lines of an AC electrical circuit, or to one current-carrying line and a ground or neutral line of an AC electrical circuit. In an example implementation of the SCCA estimation system 200, the AC electrical circuit 215 can be an AC power delivery system, and the three lines (210, 212, 214) can be power delivery lines. In a configuration, the node 205 where the current sensors (230, 232, 234) are connected to the SCCA estimation system 200 can be a point of common coupling (PCC) as that term is understood in the context of power systems. Furthermore, while the SCCA estimation system 200 is illustrated with three current sensors (230, 232, 234), in alternate configurations, fewer or greater than three current sensors can be present, such as one, two, or four. The current sensors (230, 232, 234) can optionally be Hall Effect current sensors or current to voltage transducers. In configurations incorporating more than one current sensor, the controller 240 can analyze sets of current measurements from each current sensor and can determine THDi from each set of measurements and can consider the average THDi. A configuration of the SCCA estimation system 200 can also incorporate voltage sensors to measure the voltage potential of the three lines (210, 212, 214). The voltage measurements can be used to calculate the arc flash hazard potential or arc flash hazard potential category. Additionally, the voltage measurements can be analyzed for spectral content, and information about the spectral content of the voltage waveform can be advantageously used to further refine the determination of THDi by filtering out imposed harmonic distortion in the waveform. Determining THDi by utilizing spectral content information from the voltage waveform can result in a more accurate estimation of SCCA.

The controller 240 is configured to analyze the current measurements to determine the total harmonic current distortion (THDi) of the current drawn by the DC charging circuit 220. The controller 240 performs a spectral analysis of the measured current. The controller finds the content of measured current at the fundamental frequency of voltage or current in the AC electrical circuit 215 and at selected harmonic frequencies of the fundamental frequency. The controller 240 then determines THDi by computing the ratio between the measured current at the selected harmonic frequencies and the fundamental frequency. Alternatively, the controller 240 can compute the THDi by determining the ratio of the measured current at selected harmonic frequencies to total current. For example, the fundamental frequency of the voltage or current in the AC electrical circuit 215 can be 60 hertz or 50 hertz, and the harmonic frequencies occur at integer multiples of the fundamental frequency. For example, the current sensors (230, 232, 234) can be configured to sample the current flowing into the DC charging circuit 220 at regular intervals at a rate of 250 kilohertz, or at another rate suitable for analyzing the measured current at a desired frequency subject to the limitations of the Nyquist theorem. In the SCCA estimation system 200 illustrated in FIG. 2A, once the measured current is received by the controller 240, digital signal processing techniques can be employed to examine the measured current for its spectral features. For example, the measured current can optionally be analyzed using a fast Fourier transform, a discrete Fourier transform, or any other method for computing the content of a measured signal at particular identified frequencies.

In implementations of the present disclosure, the DC charging circuit 220 can optionally be permanently connected to the AC electrical circuit 215. For example, in a configuration where the AC electrical circuit 215 is an AC power circuit, the DC charging circuit 220 can be an electronic component incorporated into an electrical panel. In such an example configuration, the SCCA estimation system 200 is implemented by measuring the current drawn by the DC charging circuit 220 and analyzing the set of current measurements with a controller 240. In implementations of the SCCA estimation system 200, the inductance, capacitance, and resistance of the DC charging circuit 220 can be due to an electronic component being powered by the DC charging circuit. In implementations of the SCCA estimation system 200, the inductance, capacitance, and resistance of the DC charging circuit 220 can optionally be adjustable.

Figure 2B:
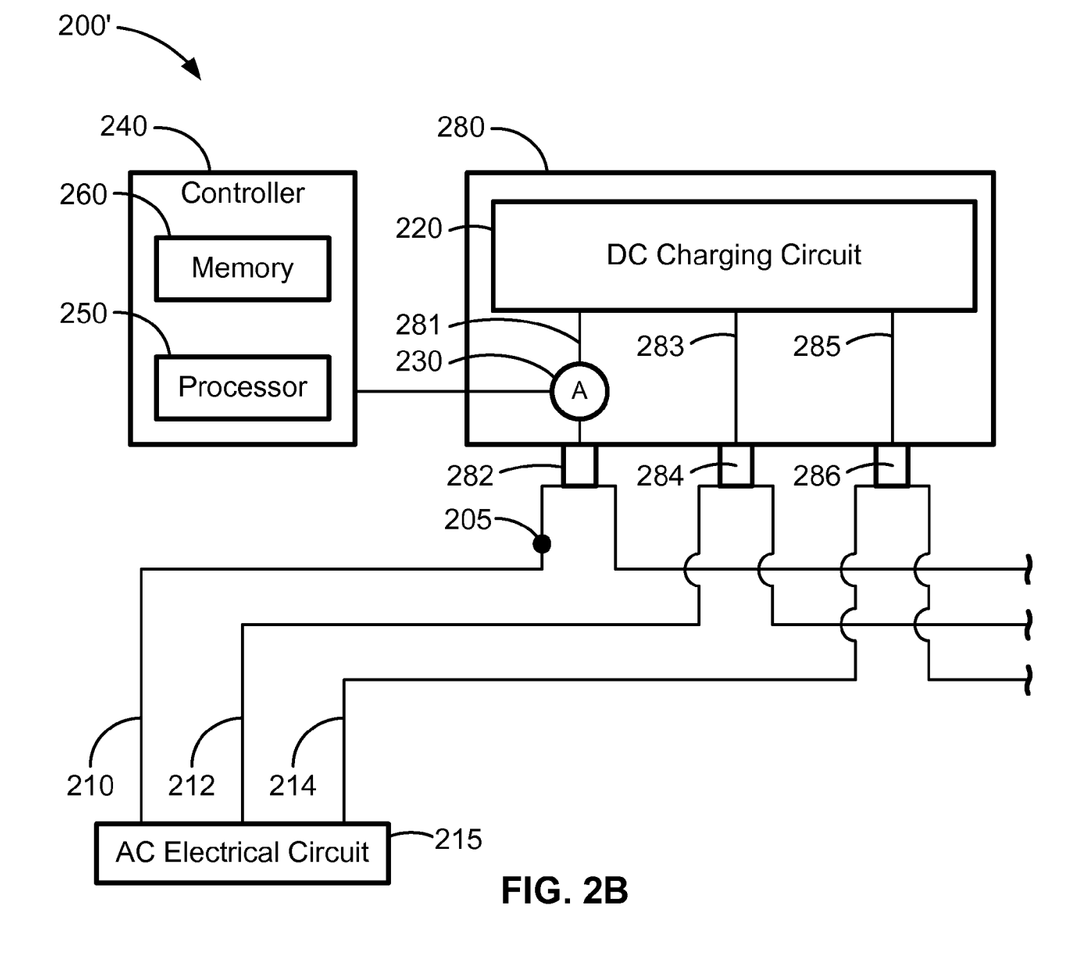
FIG. 2B provides an example configuration of a system for measuring the total harmonic current distortion of current flowing into a direct current charging circuit removably connected to a node of an alternating current electrical circuit.

FIG. 2B provides an alternative implementation of the SCCA estimation system 200' incorporating a DC charging circuit 220 that is removably connected to the AC electrical circuit 215. Referring now to FIG. 2B, the AC electrical circuit 215 has three lines (210, 212, 214), and each is electrically connected to the DC charging circuit 220. The DC charging circuit 220 is housed within a case 280. The case 280 has conductive terminals (282, 284, 286) accessible from the exterior of the case 280. The conductive terminals (282, 284, 286) are adapted to make an electrical connection with the three lines (210, 212, 214) of the AC electrical circuit 215. The first line 210 is connected to a first conductive terminal 282; the second line 212 is connected to a second conductive terminal 284; and the third line 214 is connected to a third conductive terminal 286. The conductive terminals (282, 284, 286) are electrically connected to the DC charging circuit 220 with conductors (281, 283, 285) housed within the case 280. The case 280 further includes the current sensor 230, which measures the current drawn through the first line 210. The current sensor 230 is connected to the controller 240 and is configured to send a set of current measurements to the controller 240. In the exemplary implementation provided only the current drawn through the first line 210 is measured with the current sensor 230 to provide a set of current measurements to the controller 240, however implementations of the present disclosure may incorporate current sensors measuring the current drawn through each of the three lines. In implementations where the DC charging circuit 220 is removably connected to the AC electrical circuit 215, the DC charging circuit can be engineered to have a particular inductance, capacitance, and resistance suitable for estimating a quantity of SCCA at the node 205. The inductance, capacitance, and resistance of the DC charging circuit 220 can optionally be adjustable. The SCCA estimation system 200' provided in FIG. 2B is shown with the controller 240 located outside of the case 280, but the present disclosure is not so limited. The case 280 housing the DC charging circuit 220 can optionally house the controller 240. The controller 240 is configured to use the processor 250 and the memory 260 to analyze the set of current measurements from the current sensor 230 to determine THDi, and use an established correlation to estimate a corresponding value of SCCA of the AC electrical circuit 215 at the node 205.

The SCCA at the node 205 of the AC electrical circuit 215 can be estimated based on the THDi of the current drawn by the DC charging circuit 220. The estimation is performed utilizing a correlation established between the quantity of SCCA at the node 205 and the THDi of current drawn by the DC charging circuit 220. The correlation between THDi and SCCA for the DC charging circuit 220 can be established according to a method outlined below in connection with discussion of FIG. 3. In brief, the correlation can be established by determining the THDi when the DC charging circuit 220 is connected to a calibrated AC electrical circuit 215 having a known value of SCCA. The SCCA of the AC electrical circuit 215 can be modified and the THDi can be determined repeatedly until a correlation pattern is determined. Once a correlation pattern is established for the particular DC charging circuit 220, subsequent determinations of THDi can be used to estimate a quantity of SCCA. The correlation between THDi and SCCA can optionally be established through computational simulation of an accurate electrical model of the DC charging circuit 220.

Figure 2C:
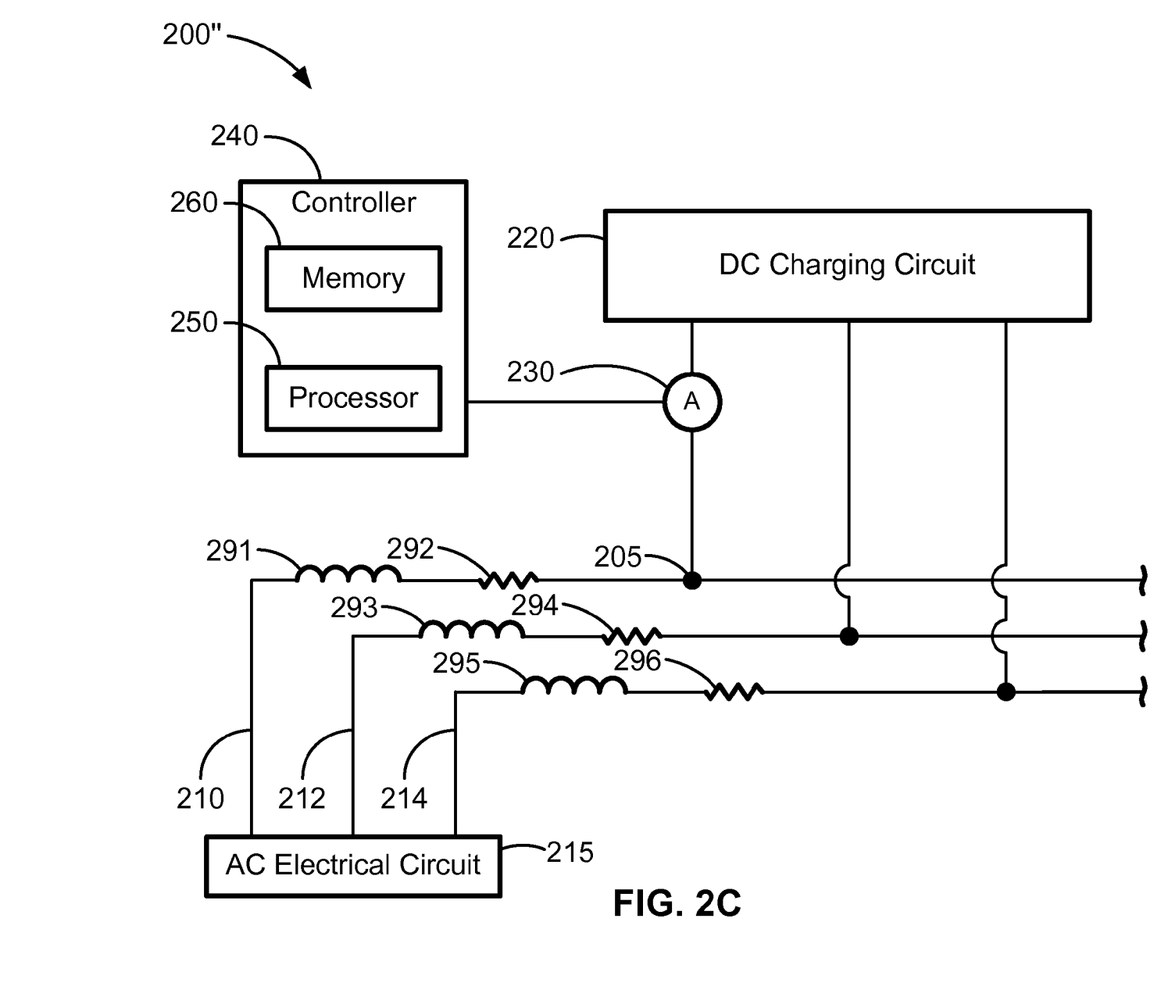
FIG. 2C provides an example configuration of a system for measuring the total harmonic distortion of current flowing into a direct current charging circuit useful for generating experimental results of the relationship between the total harmonic current distortion and short circuit current available.
Figure 3:
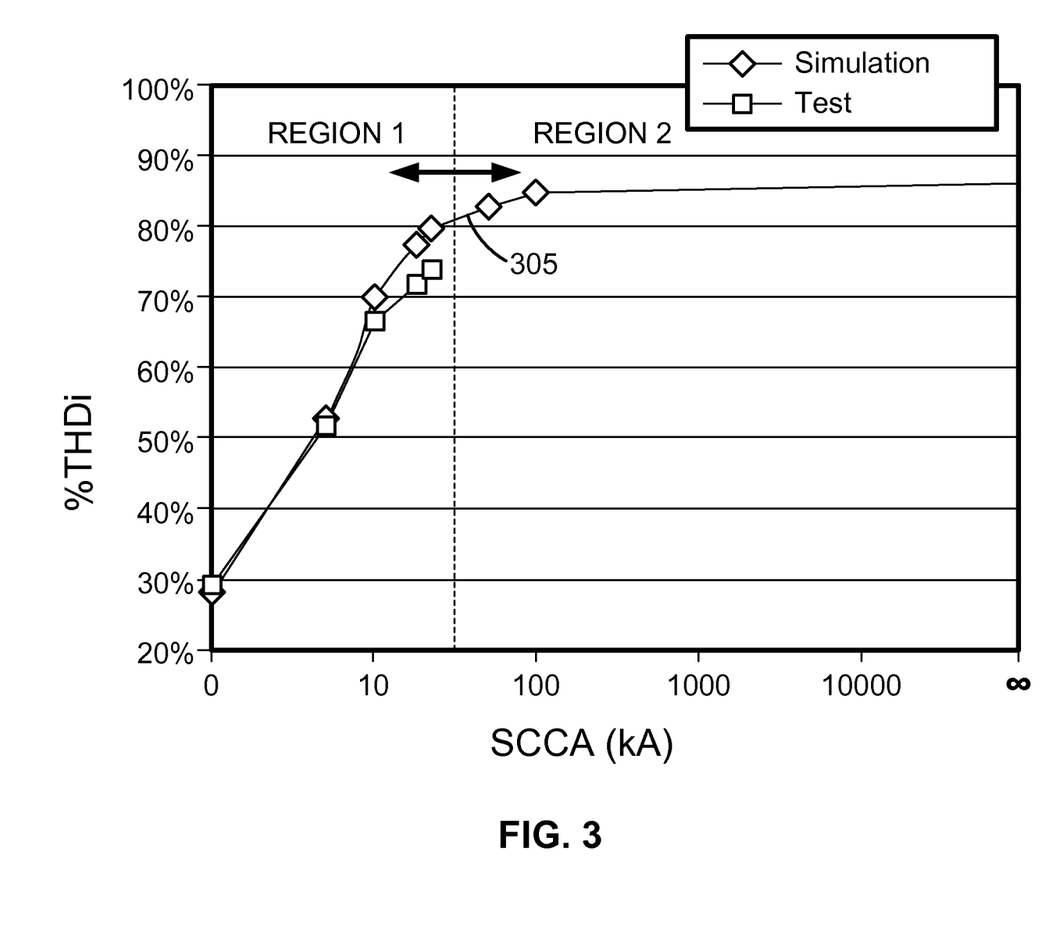
FIG. 3 illustrates a chart showing experimental and simulation results demonstrating the relationship between the total harmonic current distortion and short circuit current available.

FIG. 2C provides still another example configuration of the SCCA estimation system 200″ useful for generating experimental results of the relationship between THDi and SCCA. The experimental results shown in FIG. 3 are generated using a configuration of the SCCA estimation system 200″ shown in FIG. 2C. Referring now to FIG. 2C, the AC electrical circuit 215 is implemented with an ATV61HD55N4 AC Drive three phase power converter available from Schneider Electric. The current sensor 230 is implemented with a Yokogawa PZ4000 Power Analyzer operating at a sampling frequency of 250 kHz. The DC charging circuit 220 is implemented having an inductance and capacitance matching the nominal values of the ATV61HD55N4 AC Drive three phase power converter. The inductor 222 has a value of 0.12 mH, and the capacitor 224 has a value of 3.9 mF. The value of the resistor 226 is selected to allow the AC electrical circuit 215 to reach a power output of 79.8 kW. Accordingly, exemplary values of the resistor 226 for each of the experimental results are provided below in Table 1. While the AC electrical circuit 215 includes three lines (210, 212, 214) connected to the DC charging circuit 220, in the exemplary implementation provided only current flowing through the first line 210 is measured with the current sensor 230. The first line 210 extending from the AC electrical circuit 215 is connected to a first load resistor 292 and a first load inductor 291. Similarly, the second line 212 is connected to a second load resistor 294 and a second load inductor 293, and the third line 214 is connected to a third load resistor 296 and a third load inductor 295. The load resistors (292, 294, 296) and the load inductors (291, 293, 295) combine to simulate an inductive load on the AC electrical circuit 215.

FIG. 3 illustrates an example chart showing experimental and simulation results demonstrating a relationship between THDi and SCCA. The chart shown in FIG. 3 includes two sets of data. The square-shaped points are experimental results gathered with the configuration of the SCCA estimation system 200″ shown in FIG. 2C. The diamond-shaped points are simulation results determined by simulating the performance of the SCCA estimation system 200″ in a circuit simulation software program, namely Simulation Program with Integrated Circuit Emphasis (SPICE), which is a general-purpose open source electronic circuit simulator. Examination of the chart illustrated in FIG. 3 reveals two regions labeled Region 1 and Region 2. In the particular configuration measured and simulated, Region 1 corresponds to values of SCCA below roughly 30 kA, and Region 2 corresponds to values of SCCA above roughly 30 kA. The point of transition between Region 1 and Region can be described as an inflection point 305, or informally as a "knee" in the correlation relationship. A precise mathematical description of the relationship between THDi and SCCA that spans both Region 1 and Region 2 may not be possible, but in Region 1 the relationship can be modeled with a third order polynomial, and in Region 2 the relationship can be modeled as a logarithmic relationship. In Region 1, the impedance of the AC electrical circuit 215 dominates such that decreasing the impedance of the AC electrical circuit 215 corresponds to greater generation of harmonic currents in the DC charging circuit 220. The impedance of load inductors (291, 293, 295) of the AC electrical circuit 215 is lower at larger values of SCCA as discussed below and shown in Table 1. According to the example configuration illustrated, changes in the impedance load inductors (291, 293, 295) of the AC electrical circuit 215 in Region 2 do not significantly impact the generation of harmonic currents in the DC charging circuit 220.

Referring again to FIG. 2C, adjusting the values of the load resistors (292, 294, 296) and the load inductors (291, 293, 295) allow for the AC electrical circuit 215 to have specific values of SCCA at the node 205. To generate the experimental results shown in the chart illustrated in FIG. 3, the values were adjusted to provide the following SCCA values at the node 205: 1 kA, 5 kA, 10 kA, 18 kA, and 22 kA. The values of the load resistors (292, 294, 296) and the load inductors (291, 293, 295) for each value of SCCA are provided below in Table 1. The reactance of the load for a frequency of 60 hertz is also provided in Table 1. These values were selected such that the power factor, the ratio of the reactance of the load to the load resistance, was 80% for each value of SCCA generated. In Table 1 below, the leftmost column provides the values of SCCA generated by the AC electrical circuit 215 at the node 205. The second column under the heading Rp provides the values of the load resistors (292, 294, 296); the third column under the heading Lp provides the values of the load inductors (291, 293, 295). The fourth column under the heading Xp provides the reactance of the AC electrical circuit 215 at a frequency of 60 hertz. The fifth column under the heading R provides the values of the resistor 226 selected to allow the AC electrical circuit 215 to reach a power output of 79.8 kW for each generated value of SCCA.

TABLE 1

Experimental SCCA Estimation System Values

| SCCA (kA) | Rp (Ohm) | Lp (mH) | Xp (Ohm) | R (Ohm) |
|---|---|---|---|---|
| 1 | 0.222 | 0.441 | 0.166 | 5.38 |
| 5 | 0.044 | 0.088 | 0.033 | 5.51 |
| 10 | 0.022 | 0.044 | 0.017 | 5.52 |
| 18 | 0.012 | 0.024 | 0.009 | 5.535 |
| 22 | 0.01 | 0.02 | 0.008 | 5.55 |

The chart illustrated in FIG. 3 also provides results from a simulation of operation of the SCCA estimation system 200″ shown in FIG. 2C using SPICE software. The simulation results appear as diamond-shaped points on the chart illustrated in FIG. 3. The results of the SPICE simulation are gathered for each of the SCCA values measured experimentally. Additionally, simulation values of THDi are computed using SPICE software for values of SCCA at 50 kA, 100 kA, and infinity. The final three simulation results are gathered, at least in part, to better understand the behavior of the relationship between THDi and SCCA in Region 2 as indicated in the chart shown in FIG. 3. For the final three simulation results, the power factor, which is the ratio of the load resistor 226 to the reactance of load at 60 hertz, is set to 20% rather than 80%.

Table 2 provides the results of the experimental results described above and displayed in the chart illustrated in FIG. 3. The values in Table 2 include the content of the measured current at the fundamental frequency and at selected harmonic frequencies. The value of THDi is also provided. THDi is calculated by taking the square root of the sum of the squares of the measured current at the selected harmonic frequencies and dividing by the measured current at the fundamental frequency. In Table 2, the sum of the squares of the measured current at the selected harmonic frequencies is also tabulated and referred to as $I_{harm}$. Similarly, Table 3 provides the results of the simulation results described above and displayed in FIG. 3.

TABLE 2

Experimental Results

| Harmonic | 1 kA | 5 kA | 10 kA | 18 kA | 22 kA |
|---|---|---|---|---|---|
| Fundamental | 108.22 | 103 | 110.03 | 109.48 | 109.78 |
| 5 | 30.17 | 48.03 | 63.43 | 67.53 | 69.54 |
| 7 | 7.49 | 23.94 | 36.25 | 41.02 | 42.76 |
| 11 | 2.69 | 3.78 | 3.84 | 3.89 | 4.28 |
| 13 | 0.93 | 1.45 | 2.21 | 2.16 | 2.21 |
| 17 | 0.18 | 0.37 | 0.36 | 0.37 | 0.4 |
| 19 | 0.12 | 0.16 | 0.22 | 0.18 | 0.2 |
| 23 | 0.03 | 0.08 | 0.07 | 0.07 | 0.07 |
| 25 | 0.02 | 0.04 | 0.06 | 0.04 | 0.03 |
| 29 | 0.03 | 0.02 | 0.01 | 0.01 | 0.01 |
| 31 | 0.01 | 0.02 | 0.04 | 0.02 | 0.03 |
| $I_{harm}$ | 31.21 | 53.82 | 73.19 | 79.14 | 81.77 |
| THDi | 29% | 52% | 67% | 72% | 74% |

TABLE 3

Simulation Results

| Harmonic | 1 kA | 5 kA | 10 kA | 18 kA | 22 kA | 50 kA | 100 kA | Infinite |
|---|---|---|---|---|---|---|---|---|
| Fundamental | 131.29 | 127.4 | 129.6 | 130.83 | 130.88 | 130.83 | 131.09 | 132.72 |
| 5 | 34.97 | 59.77 | 76.86 | 85.61 | 87.03 | 89.27 | 91.45 | 94.54 |
| 7 | 8.4 | 28.49 | 45.54 | 53.81 | 55.54 | 58.65 | 61.60 | 65.30 |
| 11 | 6.54 | 8.57 | 7.53 | 9.24 | 10.02 | 12.07 | 13.92 | 16.32 |
| 13 | 4.1 | 5.89 | 8.89 | 8.76 | 8.47 | 8.29 | 7.90 | 7.75 |
| 17 | 1.96 | 4.26 | 3.96 | 5.16 | 5.6 | 6.44 | 7.10 | 7.77 |
| 19 | 1.84 | 2.73 | 3.66 | 3.5 | 3.48 | 3.82 | 4.22 | 4.88 |
| 23 | 1 | 2.62 | 2.54 | 3.07 | 3.25 | 3.53 | 3.62 | 3.61 |
| 25 | 0.83 | 1.76 | 2.09 | 2.18 | 2.28 | 2.63 | 2.94 | 3.26 |
| 29 | 0.73 | 1.74 | 1.78 | 1.88 | 1.95 | 2.00 | 1.93 | 1.87 |
| 31 | 0.59 | 1.28 | 1.41 | 1.62 | 1.68 | 1.86 | 1.94 | 1.97 |
| $I_{harm}$ | 36.91 | 67.32 | 90.35 | 102.21 | 104.39 | 108.2 | 111.85 | 116.81 |
| THDi | 28% | 53% | 70% | 78% | 80% | 83% | 85% | 88% |

Once the correlation between THDi and SCCA is established for a particular DC charging circuit, the correlation can be used to estimate a quantity of SCCA. This estimation can be performed in multiple different ways. For example, the estimation can be performed using a look-up table. A table of THDi values corresponding to quantities of SCCA can be stored. When a present value of THDi is determined, the quantity of SCCA corresponding to a stored value of THDi closest or equal to the present value of THDi can be returned. Alternatively, an interpolation of the values in the table can be performed. For example, when a present value of THDi is between two stored values of THDi in the table, the corresponding calibrated quantities of SCCA can be interpolated to return a quantity of SCCA intermediate to the values provided in the table. In an example implementation, the interpolation can be performed by using the controller 240 to compute a linear interpolation, that is, a first order polynomial interpolation, of the calibrated quantities of SCCA in the table corresponding to the two stored values of THDi closest or equal in value to the present value of THDi. Similarly, the interpolation can be performed by using the controller 240 to compute a second order polynomial interpolation of the calibrated quantities of SCCA in the table corresponding to the three saved values of THDi closest or equal in value to the present value of THDi. Similarly, the interpolation can be performed by using the controller 240 to compute a third order polynomial interpolation of the calibrated quantities of SCCA in the table corresponding to the four saved values of THDi closest or equal in value to the present value of THDi. In another example implementation, the estimation of a quantity of SCCA can be performed by using the controller 240 to evaluate a mathematical function at the determined value of THDi. The mathematical function can be a third order polynomial that best fits the correlation data according to any technique for fitting a mathematical function to a set of data. An implementation can provide a mathematical function that describes the region of the correlation relationship with behavior similar to that shown in Region 1 of the chart shown in FIG. 3.

As described above, the chart shown in FIG. 3 illustrates two regions in the relationship between THDi and SCCA, Region 1 and Region 2. Region 1 and Region 2 are divided by an inflection point 305. According to an aspect of the present disclosure, altering the values of the inductor 222 or the capacitor 224 in the DC charging circuit 220 alters the location of the inflection point 305 such that a larger or smaller range of SCCA values are contained within Region 1. In an example configuration, the inductance or capacitance of the DC charging circuit 220 are advantageously selected such that Region 1 spans a range of values of SCCA that are anticipated to be present at the node 205 in the AC electrical circuit 215 that is sought to be monitored. As discussed previously, Region 1 corresponds to a range of values of SCCA where changes in the impedance of the AC electrical circuit 215 correspond to changes in the harmonic current generation in the DC charging circuit 220 that can be accurately modeled with, for example, a third order polynomial equation. Thus, by choosing values of the inductor 222 and the capacitor 224 to give the DC charging circuit 220 a lower reactance than the values utilized to generate the experimental results illustrated in the chart shown in FIG. 3, the inflection point 305 moves to the right such that a larger range of values of SCCA are contained in Region 1. According to an aspect of the present disclosure, providing a smaller impedance or resistance for the DC charging circuit 220 allows the impedance or reactance of the AC electrical circuit 215 to dominate over a larger range than the example configuration that provided the experimental and simulation results illustrated in the chart shown in FIG. 3 and provided in Tables 2-3.

The values of the inductor 222 and the capacitor 224 in the DC charging circuit 220 can be adjusted dynamically to maintain the relationship between THDi and SCCA in a range that can be accurately modeled. For example, dynamically adjusting the values of the inductor 222 or capacitor 224 can maintain the correlation relationship in a region that is modeled with a third order polynomial, such as a region similar to Region 1 in the chart illustrated in FIG. 3. In an example configuration the inductance of the inductor 222 or the capacitance of the capacitor 224 of the DC charging circuit 220 can be adjustable by the controller 240 in response to an estimated quantity of SCCA exceeding a threshold or falling below a threshold, or in response to a rate of change of estimated quantities of SCCA exceeding a threshold or falling below a threshold. Alternatively, the inductance or capacitance of the DC charging circuit 220 can be adjustable by the controller 240 in response to determined values of THDi exceeding a threshold or falling below a threshold, or in response to a rate of change of determined values of THDi exceeding a threshold or falling below a threshold.

While particular implementations and applications of the present disclosure have been illustrated and described, it is to be understood that the present disclosure is not limited to the precise construction and compositions disclosed herein and that various modifications, changes, and variations can be apparent from the foregoing descriptions without departing from the spirit and scope of the invention as defined in the appended claims.

What is claimed is:

1. A method of estimating a quantity of short circuit current available (SCCA) at a node of an alternating current (AC) electrical circuit, the AC electrical circuit including a direct current (DC) charging circuit, the method comprising:
   electrically connecting the DC charging circuit to the node;
   measuring a current flowing into the DC charging circuit to produce a set of current measurements;
   determining a total harmonic current distortion (THDi) based on the set of current measurements;
   estimating a quantity of SCCA at the node based on the determined THDi, and on an established correlation between a known THDi and a known SCCA for the DC charging circuit; and
   storing the estimate of a quantity of SCCA in a memory.

2. The method of claim 1, wherein the estimating is performed by comparing the determined THDi to a table of THDi values corresponding to quantities of SCCA and selecting the value of THDi closest or equal to the determined THDi to reach an estimate of a quantity of SCCA.

3. The method of claim 1, wherein the estimating is performed by comparing the determined THDi to a table of THDi values corresponding to quantities of SCCA and interpolating the points in the table to reach an estimate of a quantity of SCCA.

4. The method of claim 3, wherein the interpolating is performed by computing a first order polynomial interpolation, a second order polynomial interpolation, or a third order polynomial interpolation.

5. The method of claim 1, wherein the estimating is performed by evaluating a predetermined or calculated mathematical function at a value of the determined THDi.

6. The method of claim 1, the method further comprising:
   communicating an alert in the event the estimate of a quantity of SCCA exceeds a threshold value.

7. The method of claim 1, the method further comprising:
   estimating an arc flash incident hazard potential or an arc flash hazard potential category according to a function that includes the estimate of a quantity of SCCA.

8. The method of claim 7, the method further comprising:
   communicating an indication of the arc flash incident hazard potential or the arc flash incident hazard potential category.

9. The method of claim 1, wherein the DC charging circuit has a resistance, an inductance, or a capacitance and wherein the resistance, the inductance, or the capacitance is adjustable.

10. The method of claim 9, the method further comprising:
    responsive to the determining the THDi, adjusting the resistance, the inductance, or the capacitance based on the determined THDi.

11. The method of claim 1, the method further comprising:
    before electrically connecting the DC charging circuit to the node:
    connecting a calibration circuit to the DC charging circuit;
    establishing, for the DC charging circuit, the established correlation using the calibration circuit;
    disconnecting the DC charging circuit from the calibration circuit.

12. A method of estimating a quantity of short circuit current available (SCCA) at a node in an alternating current (AC) electrical circuit, the method comprising:
    connecting a direct current (DC) charging device to the node, wherein the device has a case that houses the DC charging circuit, the device further having a conductive terminal accessible from the exterior of the case;
    measuring current flowing into the direct current charging circuit through the conductive terminal to produce a set of current measurements;
    analyzing the set of current measurements to determine a total harmonic current distortion (THDi);
    estimating a quantity of SCCA at the node based on the determined THDi;
    storing the estimate of a quantity of SCCA in a memory.

13. The method of claim 12, wherein the case of the DC charging device further houses a current sensor configured to measure current flowing into the DC charging circuit, and wherein the device is connected to a controller having a memory and a processor, and wherein the controller is configured to receive current measurements from the current sensor.

14. The method of claim 12, wherein the estimating is performed by comparing the determined THDi to a table of THDi values corresponding to quantities of SCCA and selecting the value of THDi closest or equal to the determined THDi to reach an estimate of a quantity of SCCA.

15. The method of claim 12, wherein the estimating is performed by comparing the determined THDi to a table of THDi values corresponding to quantities of SCCA and interpolating the points in the table to reach an estimate of a quantity of SCCA.

16. The method of claim 15, wherein the interpolating is performed by computing a first order polynomial interpolation, a second order polynomial interpolation, or a third order polynomial interpolation.

17. The method of claim 12, wherein the estimating is performed by evaluating a predetermined or calculated mathematical function at a value of the determined THDi.

18. The method of claim 12, the method further comprising:
estimating an arc flash incident hazard potential or an arc flash hazard potential category according to a function including the estimate of a quantity of SCCA.

19. The method of claim 18, the method further comprising:
communicating an indication of the arc flash incident hazard potential or the arc flash incident hazard potential category.

20. The method of claim 12, wherein the DC charging circuit has a resistance, an inductance, or a capacitance and wherein the resistance, the inductance, or the capacitance is adjustable, the method further comprising:
responsive to the determining the THDi, adjusting the resistance, the inductance, or the capacitance based on the determined THDi.

21. A method of estimating a quantity of short circuit current available (SCCA) at a node in an alternating current (AC) electrical circuit, the AC electrical circuit having a direct current (DC) charging circuit, the method comprising: electrically connecting the DC charging circuit to the node; measuring current flowing into the DC charging circuit to produce a set of current measurements; analyzing the set of current measurements to determine a total harmonic current distortion (THDi); estimating a quantity of SCCA at the node based on the determined THDi; measuring a voltage potential of the AC electrical circuit at the node; estimating an arc flash incident hazard potential or an arc flash hazard potential category according to a function including the estimate of a quantity of SCCA and the measured voltage potential; and storing the estimate of the arc flash hazard potential or the arc flash hazard potential category in a memory.

* * * * *